(12) United States Patent
Raberg et al.

(10) Patent No.: US 6,567,300 B1
(45) Date of Patent: May 20, 2003

(54) NARROW CONTACT DESIGN FOR MAGNETIC RANDOM ACCESS MEMORY (MRAM) ARRAYS

(75) Inventors: Wolfgang Raberg, Fishkill, NY (US); Heinz Hoenigschmid, Essex Junction, VT (US)

(73) Assignee: Infineon Technologies, AG, Munich (DE)

( * ) Notice: Subject to any disclaimer, the term of this patent is extended or adjusted under 35 U.S.C. 154(b) by 0 days.

(21) Appl. No.: 10/080,415

(22) Filed: Feb. 22, 2002

(51) Int. Cl.[7] ............................................... G11C 11/15
(52) U.S. Cl. ...................... 365/173; 365/171; 365/158; 365/66; 365/55
(58) Field of Search ................................ 365/171, 173, 365/158, 66, 55

(56) References Cited

U.S. PATENT DOCUMENTS

| | | | | |
|---|---|---|---|---|
| 6,005,798 A | * | 12/1999 | Sakakima et al. | 360/324.11 |
| 6,104,633 A | * | 8/2000 | Abraham et al. | 365/171 |
| 6,236,590 B1 | * | 5/2001 | Bhattacharyya et al. | 365/158 |
| 6,256,222 B1 | * | 7/2001 | Sakakima et al. | 365/158 |
| 6,331,944 B1 | * | 12/2001 | Monsma et al. | 365/158 |
| 6,404,673 B1 | * | 6/2002 | Matsui | 365/158 |

* cited by examiner

*Primary Examiner*—Michael S. Lebentritt
*Assistant Examiner*—Toan Le
(74) *Attorney, Agent, or Firm*—Slater & Matsil, L.L.P.

(57) ABSTRACT

An MRAM device (200) and method of manufacturing thereof having second conductive lines (228) with a narrow width. The second conductive lines (228) partially contact the resistive memory elements (214), reducing leakage currents in neighboring cells (214).

31 Claims, 2 Drawing Sheets

NARROW CONTACT DESIGN FOR MAGNETIC RANDOM ACCESS MEMORY (MRAM) ARRAYS

TECHNICAL FIELD

The present invention relates generally to the fabrication of semiconductor devices, and more particularly to magnetic random access memory (MRAM) devices.

BACKGROUND OF THE INVENTION

Semiconductors are used for integrated circuits for electronic applications, including radios, televisions, cell phones, and personal computing devices, as examples. One type of semiconductor device is a semiconductor storage device, such as a dynamic random access memory (DRAM) and flash memory, which use a charge to store information.

A more recent development in memory devices involves spin electronics, which combines semiconductor technology and magnetics. The spin of an electron, rather than a charge, is used to indicate the presence of a "1" or "0". One such spin electronic device is a magnetic random-access memory (MRAM), which includes conductive lines positioned perpendicular to one another in different metal layers, the conductive lines sandwiching a magnetic stack. The place where the conductive lines intersect is called a cross-point. A current flowing through one of the conductive lines generates a magnetic field around the conductive line and orients the magnetic polarity into a certain direction along the wire or conductive line. A current flowing through the other conductive line induces the magnetic field and can partially turn the magnetic polarity, also. Digital information, represented as a "0" or "1", is storable in the alignment of magnetic moments. The resistance of the magnetic component depends on the moment's alignment. The stored state is read from the element by detecting the component's resistive state. A memory cell may be constructed by placing the conductive lines and cross-points in a matrix structure having rows and columns.

An advantage of MRAMs compared to traditional semiconductor memory devices such as DRAMs is that MRAMs are non-volatile. For example, a personal computer (PC) utilizing MRAMs would not have a long "boot-up" time, as with conventional PCs that utilize DRAMs. Also, an MRAM does not need to be powered up and has the capability of "remembering" stored data without continually requiring a refresh operation.

MRAM devices operate differently than traditional memory devices, and they introduce design and manufacturing challenges. For example, because a significantly high amount of voltage must be placed on the conductive lines to achieve a current high enough to switch the resistive state of the memory elements, leakage currents can occur from one resistive memory element to neighboring resistive memory elements. While it is unlikely that leakage current will cause switching of neighboring memory elements, leakage current is problematic in that the amount of current that leaks away is lost for the switching process for the intended memory cell. Furthermore, during a reading operation, neighboring resistors or memory elements may act as parallel resistors, thus weakening the signal from the element that is being read.

SUMMARY OF THE INVENTION

Preferred embodiments of the present invention achieve technical advantages as an MRAM device having conductive lines with smaller widths than in prior art MRAMs. The narrower conductive lines are used to switch and read out the memory cell information. In one direction of the array, the conductive lines have a smaller width than the width of the resistive memory elements, so that the resistive memory elements are not fully contacted by the conductive lines.

In one embodiment, a resistive semiconductor device includes a plurality of first conductive lines positioned parallel to one another in a first direction, a plurality of resistive memory elements disposed over the first conductive lines, and a plurality of second conductive lines disposed over the resistive memory elements. The second conductive lines are positioned parallel to one another in a second direction, and the second conductive lines partially contact the resistive memory elements.

In another embodiment, an MRAM semiconductor device includes a semiconductor substrate, a plurality of first conductive lines disposed over the substrate, the first conductive lines positioned parallel to one another in a first direction, and a plurality of resistive memory elements disposed over the first conductive lines. A plurality of second conductive lines are disposed over the resistive memory elements. The second conductive lines are positioned parallel to one another in a second direction, and the second conductive lines partially contact the resistive memory elements.

In another embodiment, a method of manufacturing an MRAM semiconductor device includes providing a semiconductor substrate, forming a plurality of a plurality of first conductive lines parallel to one another in a first direction over the substrate, disposing a plurality of resistive memory elements over the first conductive lines, and forming a plurality of second conductive lines over the resistive memory elements. The second conductive lines are positioned parallel to one another in a second direction, and the second conductive lines partially contact the resistive memory elements.

Advantages of embodiments of the invention include reducing the contact area of the second conductive lines to the resistive memory elements, reduced leakage currents, and a reduction in the number of errors and failures. Another advantage includes the ability to have wordlines and bitlines having the same widths, rather than having varying widths as in prior art magnetic memory devices, which results in a more uniform pattern from a processing perspective, simplifying the manufacturing process. The speed of a memory device may be increased, because of the reduced resistance of the memory cells resulting from the smaller number of cells being connected to the conductive lines.

BRIEF DESCRIPTION OF THE DRAWINGS

The above features of the present invention will be more clearly understood from consideration of the following descriptions in connection with accompanying drawings in which.

Corresponding numerals and symbols in the different figures refer to corresponding parts unless otherwise indicated. The figures are drawn to clearly illustrate the relevant aspects of the preferred embodiments and are not necessarily drawn to scale.

DETAILED DESCRIPTION OF PREFERRED EMBODIMENTS

A prior art MRAM design will be described, followed by a discussion of some preferred embodiments and some advantages of embodiments of the present invention.

Figure 1:
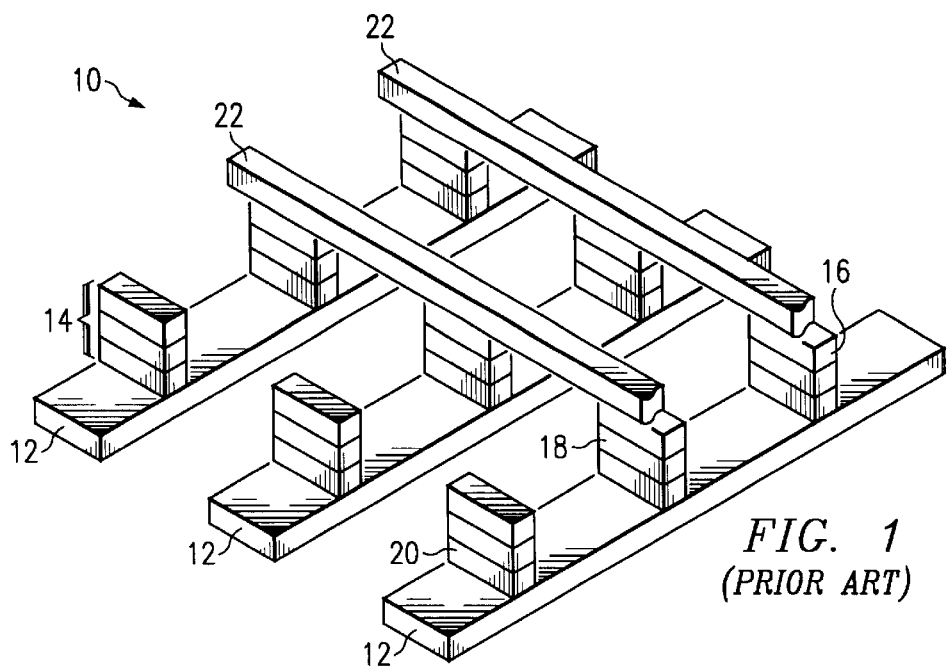
FIG. 1 illustrates a perspective view of a prior art MRAM cross-point array.

A prior art MRAM device 10 having conductive lines 12 and 22 running in a first and second direction and comprised of a conductive material such as aluminum or copper, for example, is shown in FIG. 1. A workpiece (not shown) is provided, typically comprising silicon oxide over silicon single-crystal silicon, for example. The workpiece may include other conductive layers or other semiconductor elements, e.g., transistors, diodes, etc. Compound semiconductors such as GaAs, InP, Si/Ge, and SiC may be used in place of silicon, for example.

A first inter-level dielectric layer (not shown) is deposited over the workpiece. The inter-level dielectric may comprise silicon dioxide, for example. The inter-level dielectric layer is patterned, for example, for vias, and etched. The vias may be filled with a metal such as copper, tungsten or other metals, for example.

A metallization layer, e.g. an M2 layer, is formed next. If copper is used for the conductive lines 12, typically, a damascene process is used to form the conductive lines 12. A dielectric layer, not shown, is deposited over inter-level dielectric layer 14 and vias 16. The dielectric layer is patterned and etched, and the trenches are filled with a conductive material to form conductive lines 12 in the M2 layer.

Next, a magnetic stack 14 is formed over conductive lines 12. Magnetic stack 14 typically comprises a first magnetic layer 20 including a plurality of layers of materials such as IrMn, FeMn, NiMn, PtMn, CoFe, Ru, $Al_2O_3$, and NiFe, for example. The first magnetic layer 20 is often referred to as a hard layer. Magnetic stack 14 also includes a dielectric layer 18, comprising $Al_2O_3$, for example, deposited over the first magnetic layer 20. The dielectric layer 18 is often referred to as a tunnel layer. Magnetic stack 14 also includes a second magnetic layer 16 comprising a multi-layer structure having similar materials as the first magnetic layer 20. Second magnetic layer 16 is often referred to as the soft layer. The first magnetic layer 20, dielectric layer 18 and second magnetic layer 16 are patterned to form magnetic stacks 14.

Conductive lines 22 running in a different direction than conductive lines 12 are formed over magnetic stacks 14. Conductive lines 22 may be formed within an M3 layer, for example. If conductive lines 22 comprise copper, again, a damascene process is typically used. A dielectric layer (not shown) is deposited over magnetic stacks 14 and conductive lines 22. The dielectric layer is patterned and etched with trenches that will be filled with a conductive material to form conductive lines 22. Alternatively, a non-damascene process may be used to form conductive lines 12 and 22. Conductive lines 12 and 22 function as the wordlines and bitlines of the memory array 10.

The order of the magnetic stack 14 layers may be reversed, e.g., the hard layer 20 may be on the top, and the soft layer 16 may be on the bottom of the insulating layer 18. Similarly, the wordlines 12 and bitlines 22 may be disposed either above or below the magnetic stacks 14, for example.

One type of MRAM design such as the one shown in FIG. 1 comprises an array of magnetic bits or magnetic stacks 14 situated at the cross-points between two conductive lines 12 and 22, often referred to as a cross-point design. Information is stored in the soft magnetic layer 16 of the magnetic stacks 14. To store the information, a magnetic field is necessary. This magnetic field is provided by a wordline and bitline current which is passed through conductive lines 12 and 22. Information is stored in the bits 14 by aligning the magnetization of one ferromagnetic layer (information layer) either parallel or antiparallel to a second magnetic layer (reference layer). The information is detectable due to the fact that the resistance of the element in the parallel case is different from the antiparallel case.

Switching from the parallel to the antiparallel state and vice versa is achieved by running current through conductive lines 12 and 22 which induces an magnetic field at the location of the bit 14 just large enough to change the magnetization of the information layer. A relatively high amount of voltage must be placed on the conductive lines 12/22 to achieve a current high enough to switch the resistive state of the memory elements 14, e.g., about a few milliamps, e.g., 5 mA or enough current to produce a magnetic field of approximately 100 Oe. This can result in leakage currents from one resistive memory element 14 to neighboring resistive memory elements 14, causing a portion of the current intended for the switching process to be leaked away, and therefore lost, for the intended memory cell. Furthermore, during a reading operation, neighboring resistors or memory elements 14 may act as parallel resistors, weakening the signal from the element 14 that is being read.

Figure 2:
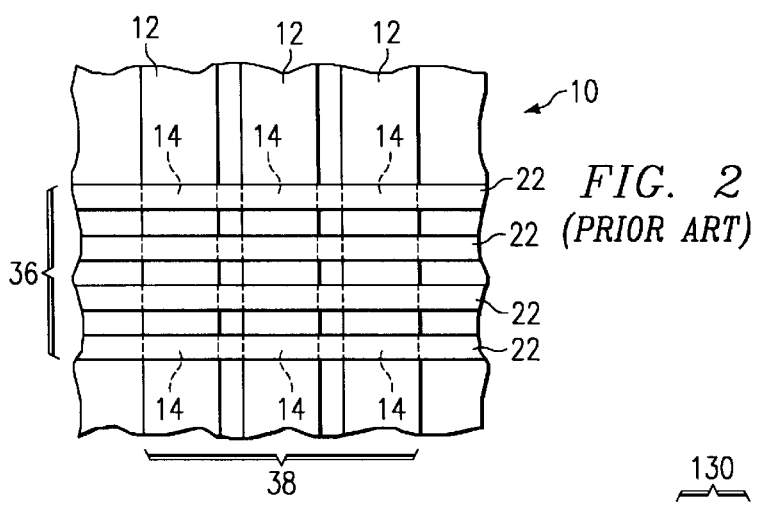
FIG. 2 shows a top view of the prior art MRAM array shown in FIG. 1.

In order to define two preferred switching states, it is often necessary to select a bit or element 14 shape which is not a quadratic cell, but rather, more elongated in a rectangular or elliptical shape, for example, with aspect ratios around 3:1, as shown in FIG. 1. An elongated shape is typically preferred for the resistive memory elements 14 because it fixes the magnetization in a certain direction, e.g., the magnetization may be along the long axis. A conventional cross-point MRAM array 10 typically comprises an $8F^2$-cell 14 (with F being the minimum feature size) with wide conductive lines 12 running perpendicular to the long axis, as shown in a top view in FIG. 2.

Embodiments of the present invention achieve technical advantages by utilizing elongated, elliptical or substantially rectangular-shaped resistive memory cells, and accessing them in a novel way, by using second conductive lines having a narrower width than in prior art MRAM designs, for switching and reading out the resistive memory cell information.

Figure 3:
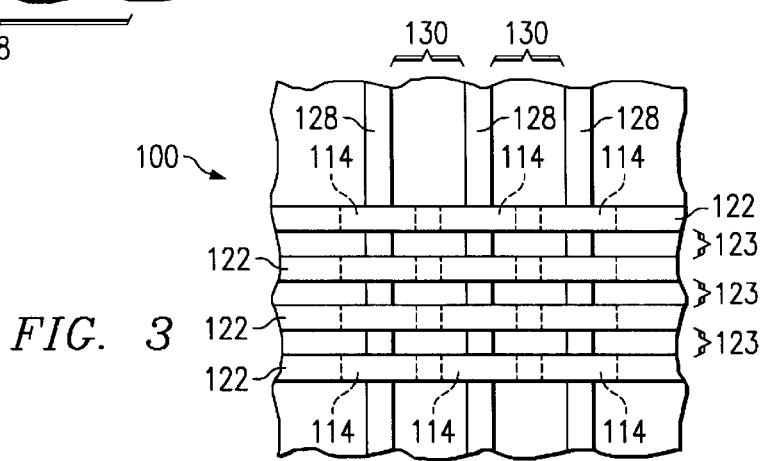
FIG. 3 shows a top view of an MRAM array in accordance with an embodiment of the present invention.

In one embodiment of an MRAM device 100 shown in FIG. 3, resistive memory elements or cells 114 are positioned in a grid or array of rows and columns at the cross-points of first and second conductive lines 122/128. Read-out of the resistive memory cells 114 is preferably accomplished through the center of the memory elements 114, e.g., the second conductive lines 128 contact the resistive memory cells 114 in a central region of the cells 114, as shown.

In the embodiment shown in FIG. 3, the resistive memory elements 114 are substantially rectangular in shape. Alternatively, the memory elements 114 may be elliptical in shape, as an example. First conductive lines 122 and second conductive lines 128 preferably have widths that are of substantially the same dimensions, e.g. between around 100 to 500 nanometers, and more preferably, around 300 nanometers. The width of the first and second conductive lines 122/128 may be the same as a minimum feature size F, for example. Preferably, second conductive lines 128 contact resistive memory elements 114 in a central region of the rectangular resistive memory elements 114. Preferably, the second conductive 128 lines only partially contact the resistive memory elements 114, in accordance with embodiments of the invention, e.g., preferably, the second conductive line 128 width is less than the width of the resistive memory elements 114.

In the preferred embodiment shown in FIG. 3, second conductive lines 128 are spaced apart by a greater distance 130 than the distance 123 the first conductive lines 122 are spaced apart. By having an increased space 130 between the second conductive lines 128, a narower contact design for the second conductive lines 128 may be achieved, in accordance with embodiments of the present invention.

Figure 4:
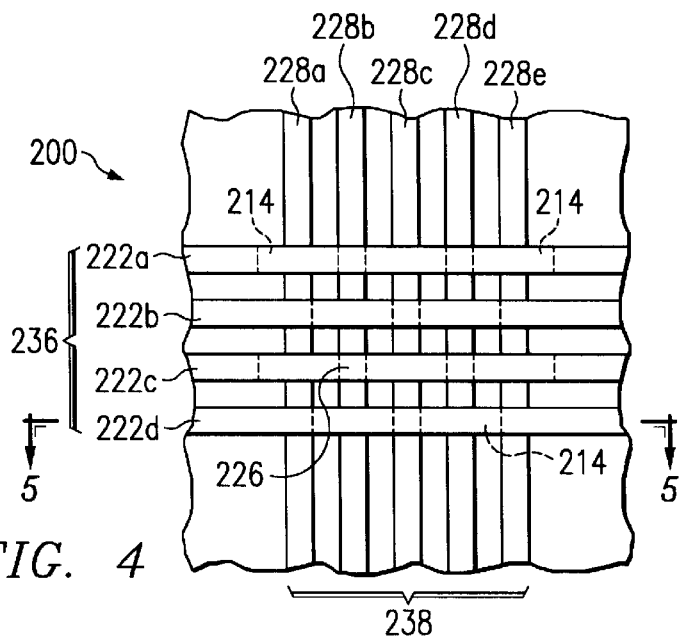
FIG. 4 shows a top view of an MRAM array in accordance with another embodiment of the present invention.

Another embodiment of the present invention is shown in a top view in FIG. 4, in which resistive memory elements 214 of MRAM device 200 are staggered or offset, with the first and second conductive lines 22/228 being arranged in a lattice configuration. The resistive memory elements 214 in adjacent rows are preferable staggered, e.g., the resistive memory elements 214 along first conductive line 222a are staggered (do not line up vertically) from the resistive memory elements 214 along first conductive line 222b. Similarly, the resistive memory elements 214 in adjacent columns are preferably staggered, e.g., the resistive memory elements 214 along second conductive line 228a are staggered (do not line up horizontally) from the resistive memory elements 214 along second conductive line 228b.

In the lattice configuration shown in FIG. 4, each first conductive line 222a, 222b, 222c, 222d contacts all resistive memory element 214 in the row, e.g., at the cross-points of either 228a, 228c, and 228e or 228b and 228d. However, in the vertical direction, each second conductive line 228a, 228b, 228c, 228d, 228e contacts every other resistive memory element 214, e.g., either at junctions 222a and 222c or at junctions 222b and 222d.

In this embodiment, the MRAM memory array 200 comprises resistive memory elements 214 that are shifted or staggered on every other first conductive line 222, allowing the second conductive line 228 layer to be designed such that the second conductive lines 228 contact only the resistive memory elements 214 on every other first conductive line 222, and passing the memory cells 214 on the other first conductive lines 222 between the resistive memory elements 214, as shown in FIG. 4. Using second conductive lines 228 having a decreased width and staggered resistive memory elements 214 results in a reduction of the number of resistive memory elements 214 per second conductive line 228 by factor of two, e.g., resulting in a lower necessary voltage drop along the second conductive lines 228, or doubling the possible array size compared to prior art MRAM designs.

Preferably, the resistive memory elements 214 are elongated, e.g., approximately a 3:1 aspect ratio, in a substantially rectangular or elliptical shape, for example. In accordance with this embodiments of the present invention, the number of contacts is reduced by offsetting the resistive memory elements 214 and introducing another set of conductive lines which connect to every other cell in the lattice configuration, e.g., second conductive line 228a is coupled to two cells 214 at the cross-points of 222a and 222c, and is not coupled to cells 214 at the cross-points of 222b and 222d. In being coupled to half the number of cells 214, the leakage current is reduced, and the operation of the second conductive lines 228 is made easier.

As in the embodiment shown in FIG. 3, preferably, the second conductive 228 lines only partially contact the resistive memory elements 214, e.g., preferably, the second conductive line 228 width is less than the width of the resistive memory elements 214 in the area of contact.

In another embodiment, both the first conductive lines 122/222 and second conductive lines 128/228 partially contact the resistive memory elements 114/214. See FIG. 5, which shows a cross-sectional view of the MRAM device 200 in the embodiment shown in FIG. 4 at view 5—5, and FIG. 6, which is a cross-sectional view of the device shown in FIG. 5 rotated ninety degrees at 6–6'. For example, the first and second conductive lines 122/222 and 128/228 may have a smaller width than the width of the resistive memory elements 114/214, further reducing leakage currents.

Figure 5:
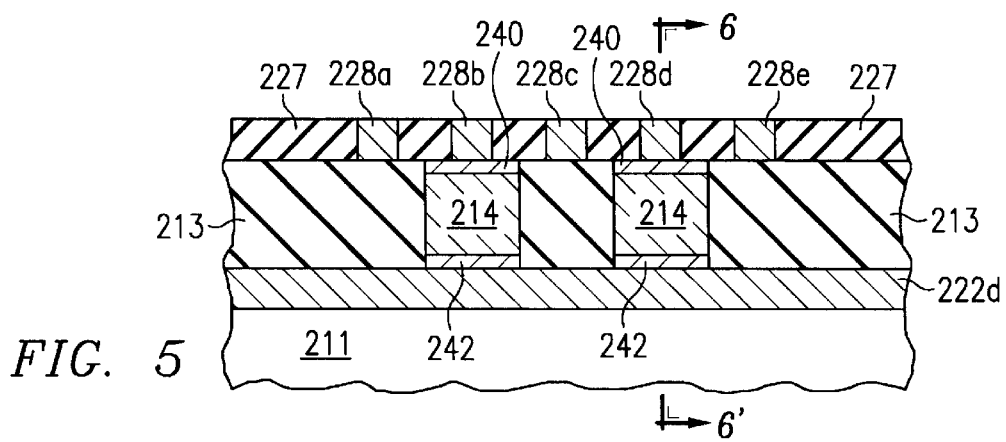
FIG. 5 illustrates a cross-sectional view of an embodiment of the MRAM array shown in FIG. 4.
Figure 6:
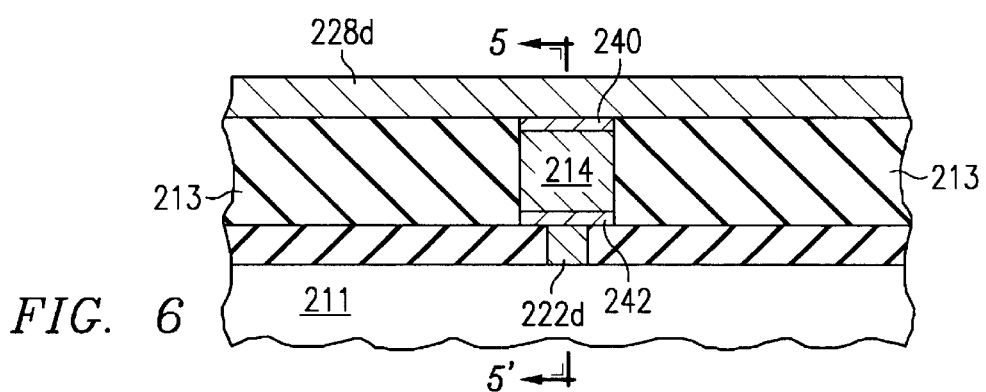
FIG. 6 illustrates a cross-sectional view rotated ninety degrees from the view shown in FIG. 5, showing a first conductive line partially contacting an MRAM element.

Referring to FIG. 5, a workpiece or substrate 211 is provided, and first conductive lines 222d are formed over the substrate 211. Resistive memory elements 214 are formed over the first conductive lines 222d within an insulating layer 213. Resistive memory elements 214 comprise a lower contact region 242 in an upper contact region 240. Second conductive lines 228a, 228b, 228c, 228d, 228e are disposed over resistive memory elements 214 within insulating layer 227, as shown. Preferably, the resistive memory element upper contact region 240 is not fully covered by the second conductive lines 228b and 228d, as shown. Also, preferably, the resistive memory element 214 lower contact region 242 is fully contacted by the first conductive lines 222d.

The resistive memory elements 214 include magnetic stacks, each having a tunnel junction. A logic state is storable in each magnetic stack. In accordance with embodiments of the present invention, magnetic switching fields are preferably applied asymmetrically in order to switch the logic state of the resistive memory elements 114/214.

Preferably, the first conductive lines 122/222 and second conductive lines 128/228 are of substantially the same width, e.g., 100 to 300 nanometers wide. This feature of embodiments of the present invention is advantageous because the conductive line pattern is simplified and therefore makes the manufacturing process of the MRAM device 100/200 easier.

Embodiments of the present invention also include a method of manufacturing a MRAM semiconductor device as described herein and depicted in FIGS. 3–5.

Embodiments of the present invention achieve technical advantages as an MRAM device that solves cell-to-cell leakage current problems found in the prior art.

In one embodiment, the number of resistive memory elements 114 is reduced along one conductive line 128 layer, which allows for an increase in the size of the array 100, reducing the apparent voltage drop along the first and second conductive lines 122/128 during writing and reading.

In accordance with embodiments of the invention, the memory element 114/224 resistance is reduced, increasing the speed of the array 100/200 compared to conventional cross-point MRAM devices, and resulting in reduced memory element-to-element 114/214 leakage currents. Reducing leakage currents results in a reduction in the number of errors and failures of the MRAM devices 100/200. The speed of the memory device may be increased, because the resistance of the memory cell may be reduced as a result of the smaller number of cells connected to the conductive lines.

In another embodiment, the size of the MRAM device 200 may be increased, resulting in an increased number of resistive memory elements 214 in a given area. For example, the array 200 may be made twice as large as in prior art MRAM designs.

Another advantage of embodiments of the present invention includes providing a uniform pattern factor for both metal layers, e.g., first conductive lines 122/222 and second conductive lines 128/228. Both metal layers have the same pattern factor, thus allowing the use of the same processes for both metal layers for first conductive lines 122/222 and second conductive lines 128/228.

Embodiments of the present invention are described with reference to a particular application for a cross-point MRAM cell 100/200 herein; however, embodiments of the invention also have application in other resistive semiconductor devices. Particularly, providing a uniform pattern factor for both metal layers, e.g., for first conductive lines 122/222 and second conductive lines 128/228, is advantageous in MRAM devices that use a FET to select the memory cell to be read, where leakage is generally not a concern.

While the invention has been described with reference to illustrative embodiments, this description is not intended to be construed in a limiting sense. Various modifications in combinations of the illustrative embodiments, as well as other embodiments of the invention, will be apparent to persons skilled in the art upon reference to the description. In addition, the order of process steps may be rearranged by one of ordinary skill in the art, yet still be within the scope of the present invention. It is therefore intended that the appended claims encompass any such modifications or embodiments. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A resistive semiconductor device, comprising:
   a plurality of first conductive lines positioned parallel to one another and positioned in a first direction;
   a plurality of resistive memory elements disposed over the first conductive lines; and
   a plurality of second conductive lines disposed over the resistive memory elements, the second conductive lines being positioned parallel to one another in a second direction, wherein the second conductive lines partially contact the resistive memory elements, wherein the first conductive lines and second conductive lines are positioned in a lattice configuration, wherein each first conductive line contacts a resistive memory element, wherein every other second conductive line contacts a resistive memory element, and wherein the resistive memory elements in adjacent rows are staggered.

2. The resistive semiconductor device according to claim 1, wherein the resistive memory elements comprise a substantially rectangular or elliptical shape, wherein the second conductive lines are disposed over a central region of the resistive memory elements.

3. The resistive semiconductor device according to claim 1, wherein the resistive memory elements are oriented in a half pitch configuration.

4. The resistive semiconductor device according to claim 1, wherein the resistive memory elements comprise an upper contact region, wherein the resistive memory element upper contact region is not fully covered by the second conductive lines.

5. The resistive semiconductor device according to claim 4, wherein the resistive memory elements comprise a lower contact region, wherein the resistive memory element lower contact region is fully contacted by the first conductive lines.

6. The resistive semiconductor device according to claim 1, wherein the resistive memory elements comprise magnetic stacks, the magnetic stacks including a tunnel junction, wherein a logic state is storable in each magnetic stack.

7. The resistive semiconductor device according to claim 1, wherein magnetic switching fields are applied asymmetrically to switch the logic state of the resistive memory elements.

8. The resistive semiconductor device according to claim 1, wherein the first and second conductive lines are substantially the same width.

9. The resistive semiconductor device according to claim 1, wherein the device comprises a magnetic random-access memory (MRAM) device.

10. The resistive semiconductor device according to claim 1, wherein the first and second conductive lines comprise wordlines and bitlines.

11. The resistive semiconductor device according to claim 1, wherein the first conductive lines partially contact the resistive memory elements.

12. A magnetic random-access memory (MRAM) semiconductor device, comprising:
    a semiconductor substrate;
    a plurality of first conductive lines disposed over the substrate, the first conductive lines positioned parallel to one another in a first direction;
    a plurality of resistive memory elements disposed over the first conductive lines; and
    a plurality of second conductive lines disposed over the resistive memory elements, the second conductive lines being positioned parallel to one another in a second direction, wherein the second conductive lines partially contact the resistive memory elements, wherein the first conductive lines and second conductive lines are positioned in a lattice configuration, wherein each first conductive line contacts a resistive memory element, wherein every other second conductive line contacts a resistive memory element, and wherein the resistive memory elements in adjacent rows are staggered.

13. The MRAM semiconductor device according to claim 12, wherein the resistive memory elements comprise an upper contact region, wherein the resistive memory clement upper contact region is not fully covered by the second conductive lines.

14. The MRAM semiconductor device according to claim 12, wherein the resistive memory elements comprise a lower contact region, wherein the resistive memory element lower contact region is fully contacted by the first conductive lines.

15. The MRAM semiconductor device according to claim 12, wherein the resistive memory elements comprise magnetic stacks, the magnetic stacks including a tunnel junction, wherein a logic state is storable in each magnetic stack.

16. The MRAM semiconductor device according to claim 15, wherein magnetic switching fields are applied asymmetrically to switch the logic state of the resistive memory elements.

17. The MRAM semiconductor device according to claim 12, wherein the resistive memory elements are oriented in a half pitch configuration.

18. The MRAM semiconductor device according to claim 12, wherein the first and second conductive lines are substantially the same width.

19. The MRAM semiconductor device according to claim 12, wherein the resistive memory elements comprise a substantially rectangular or elliptical shape, wherein the second conductive lines are disposed over a central region of the resistive memory elements.

20. The MRAM semiconductor device according to claim 12, wherein the first and second conductive lines comprise wordlines and bitlines.

21. The MRAM semiconductor device according to claim 12, wherein the first conductive lines partially contact the resistive memory elements.

22. A method of manufacturing a magnetic random-access memory (MRAM) semiconductor device, comprising:

providing a semiconductor substrate; and forming a plurality of a plurality of first conductive lines parallel to one another in a first direction over the substrate;

disposing a plurality of resistive memory elements over the first conductive lines; and forming a plurality of second conductive lines over the resistive memory elements, the second conductive lines being positioned parallel to one another in a second direction, wherein the second conductive lines partially contact the resistive memory elements, further comprising:

positioning the first conductive lines and second conductive lines in a lattice configuration, wherein each first conductive line contacts a resistive memory element, wherein every other second conductive line contacts a resistive memory element, and staggering the resistive memory elements in adjacent rows.

23. The method according to claim 22, wherein disposing the resistive memory elements comprises disposing elements comprising a substantially rectangular or elliptical shape, wherein forming the second conductive lines comprises disposed the second conductive lines over a central region of the resistive memory elements.

24. The method according to claim 22, wherein disposing the resistive memory elements comprises orienting the resistive memory elements in a half pitch configuration.

25. The method according to claim 22, wherein the resistive memory elements comprise an upper contact region, wherein the resistive memory element upper contact region is not fully covered by the second conductive lines.

26. The method according to claim 25, wherein the resistive memory elements comprise a lower contact region, wherein the resistive memory element lower contact region is fully contacted by the first conductive lines.

27. The method according to claim 22, wherein the resistive memory elements comprise magnetic stacks, the magnetic stacks including a tunnel junction, wherein a logic state is storable in each magnetic stack.

28. The method according to claim 27, wherein magnetic switching fields may be applied asymmetrically to switch the logic state of the resistive memory elements.

29. The method according to claim 22, wherein the first and second conductive lines are substantially the same width.

30. The method according to claim 22, wherein the device comprises a magnetic random-access memory (MRAM) device.

31. The method according to claim 22, wherein the first conductive lines partially contact the resistive memory elements.

* * * * *